PROCESS FOR PREPARING SEMICONDUCTOR MEMBERS

Filed Aug. 12, 1960

WITNESSES
Edwin E. Bassler
Raymond F. Majesko

INVENTORS
Edmond H. Borneman &
Frank V. Marcinko
BY
Frederick Shapoe
ATTORNEY

United States Patent Office 3,152,939
Patented Oct. 13, 1964

3,152,939
PROCESS FOR PREPARING SEMICONDUCTOR MEMBERS

Edmond H. Borneman, Jeannette, and Frank V. Marcinko, Uniontown, Pa., assignors to Westinghouse Electric Corporation, East Pittsburgh, Pa., a corporation of Pennsylvania Filed Aug. 12, 1960, Ser. No. 49,205
3 Claims. (Cl. 156—3)

The present invention relates to a process for preparing semiconductor members suitable for use in a semiconductor device.

Heretofore there has been a great deal of difficulty in dicing and etching diffused semiconductor wafers in which a thin surface layer of a doping impurity is present on one or more surfaces. These problems arise owing to the fact that the semiconductor wafers which are of a diameter of the order of from ¼ to 1 inch initially must be cut or sawed into a plurality of much smaller individual semiconductor members or dice which will be ultimately employed in semiconductor devices. The usual method for dicing semiconductor wafers is to cement the wafer on a hard surface and saw or cut directly through the wafer. However, the resulting dice or semiconductor members are difficult to handle and, due to cracking or breaking, a proportion is lost. Cutting the wafers into dice introduces saw damage along the edges of the dice which must be removed by etching of the dice. A particularly serious problem arises in that the etch also removes a substantial amount of the high conductivity surface of diffused semiconductor dice. In some cases, nearly all of the diffused surface may be etched away.

The object of the invention is to provide a process for dicing a diffused semiconductor wafer having undamaged faces, and etching away only the damaged edges of the resulting dice by adhesively applying protective glass sheets to the faces of the wafer and sawing one glass sheet and the wafer while leaving the other glass sheet intact and subjecting the assembly to etching to remove the damaged edges of the dice while the faces of the dice are protected by the applied glass sheets.

It is a further object of the present invention to provide a novel method for preparing semiconductor members suitable for use in a semiconductor device, comprising disposing and securing a flat semiconductor wafer having undamaged faces between two flat glass sheets with a thin layer of adhesive resistant to chemical etchants for the semiconductor material applied to opposite faces of the wafer and completely coating the same, securing the external face of one of the glass sheets to a dicing block, sawing through the upper glass sheet and the semiconductor wafer to provide a plurality of semi-conductor dice, removing the intact lower glass sheet supporting the semiconductor dice from the dicing block and applying an etching solution to the saw damaged edges of the semiconductor members to remove the damaged material at the edges without affecting the faces which are protected by the applied glass sheets whereby to provide a reliable p-n junction at the edges of the members.

Another object of the invention is to provide a method for dicing and selectively etching only the damaged edges of diffused semiconductor wafers whereby the dice are easily handled and are substantially totally recoverable and whereby the diffused surface on each face of the individual dice is not adversely affected by application of a chemical etchant.

Other objects of the invention will, in part, be obvious and will, in part, appear hereinafter.

For a better understanding of the nature and objects of the invention, reference should be had to the following detailed description and drawings in which.

In accordance with the present invention and in attainment of the foregoing objects there is provided a process for preparing semiconductor members suitable for use in a semiconductor device comprising (1) positioning and securing a flat semiconductor wafer having undamaged faces between two flat glass sheets with a thin layer of wax or other adhesive or binder applied to and completely coating the opposite faces of the wafer, (2) securing the external face of one glass sheet to a dicing block, (3) dicing the semiconductor wafer by sawing through the upper glass sheet and the semiconductor wafer to provide a plurality of semiconductor members, the lower glass sheet being substantially intact, (4) removing the lower glass sheet carrying the semiconductor members from the dicing block, and (5) applying an etching solution to the saw damaged edges of the assembled semiconductor dice on the lower glass sheet to provide a reliable p-n junction at the edges of the members without etching the faces of each die. Subsequently, the wax or other adhesive is dissolved or removed and the individual dice are separated for use.

Although the term "glass sheets" is used exclusively in the specification and claims as a means of protection for the semiconductor wafer, other acid resistant ceramics and even mica may be used for this purpose, and the term "glass sheets" should be understood to apply to all of these.

Figure 1:
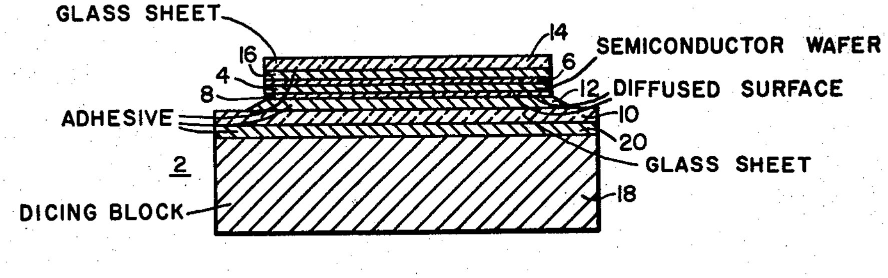
FIG. 1 is an elevation view in cross section of a semiconductor wafer being processed in accordance with the teachings of the invention.

Referring to FIG. 1 there is shown a semiconductor wafer-glass assembly 2 which is employed to position a semiconductor wafer 4 in preparation for subsequent dicing and etching operations. The semiconductor wafer 4 having diffused or other high conductivity surface layers 6 and 8 is secured to a lower flat glass sheet 10 with a thin layer of an adhesive, such as a wax, 12. The wax layer 12 is disposed between the semiconductor member and the glass sheet so that the entire lower face of the semiconductor wafer is protected. Similarly another glass sheet 14 is secured to the upper face of semiconductor wafer 6 by means of a wax layer 16. The exposed face of glass sheet 10 is then secured to a dicing block 18 by means of an adhesive such as a wax layer 20. The wax layer 20 is applied in a manner to preclude the glass sheet 10 supporting the semiconductor wafer 4 from moving during the subsequent dicing operations.

Figure 2:
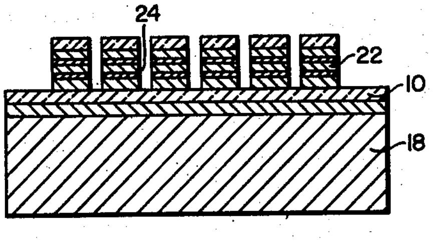
FIG. 2 is an elevation view in cross section of semiconductor dice produced by sawing of the semiconductor wafer.
Figure 3:
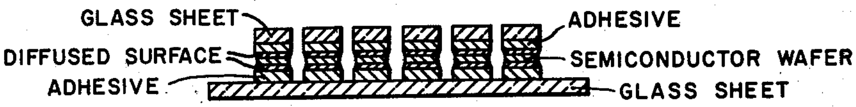
FIG. 3 is an elevation view in cross section of the semiconductor members or dice after etching.

The assembly 2 containing the semiconductor wafer is then diced by sawing through the upper glass sheet 14 and the semiconductor wafer 4, leaving the lower glass sheet 10 substantially intact, to provide a plurality of spaced semiconductor dice 22 as shown in FIG. 2. Spaces 24 are present as the result of sawing. The dicing operation causes mechanical damage to the edges of the semiconductor dice which damage must be removed by etching. The lower glass sheet 10 supporting the semiconductor dice 22 is then removed from the dicing block 18 for instance by inserting a sharp tool at layer 20. The assembly is treated with an etching solution which reaches only the saw damaged edges of the semiconductor dice. After a proper amount of etching to remove all the damaged semiconductor material, there results a reliable p-n junction at the edges of the dice without removing or otherwise impairing the diffused or the high conductivity surface layers on the faces of the dice. The resulting etched assembly is shown in FIG. 3. The etched dice may be then removed from the glass sheets by dissolving the wax between the member and the sheets.

Figure 4:
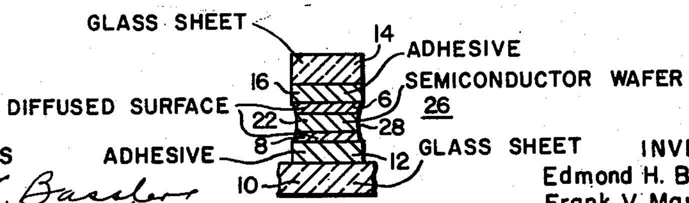
FIG. 4 is a greatly enlarged view in elevation of a die of FIG. 3.

Referring to FIG. 4, there is shown an enlarged individual semiconductor die assembly 26 after etching consisting of a section of glass sheets 10 and 14, a semiconductor die 22 and adhesives 12 and 16. The damage to the edges 28 of the die 22 has been completely removed by the etchant without adversely affecting the diffused surface layers 6 and 8.

The following example is illustrative of the teachings of the invention.

*Example*

A silicon wafer having a low concentration of n-type impurity, measuring approximately one inch in diameter and a thickness of 5 mils, was first heated in a vapor of phosphorus oxide with only one face exposed thereto and then heated in a vapor of boron oxide with the other face alone exposed thereto, to provide a highly conductive, diffused phosphorus surface layer on one face thereof and a highly conductive diffused boron surface layer on the other face thereof. The wafer was secured between two glass sheets each slightly larger than the wafer by the previously described process using wax and the outer end of one glass sheet was secured to a steel dicing block (1½ inches by 1½ inches by ¼ inch). The upper glass sheet, the wafer and both layers of wax were then sawed with a diamond saw to produce dice measuring approximately 50 mils square. The lower glass sheet was substantially intact. The lower glass sheet was then removed from the dicing block by inserting a sharp tool therebetween. A CP-4 etching solution was applied to the assembly so as to reach all the saw damaged edges of the silicon dice for a period of approximately 2 minutes. After washing with distilled water, the assembly was then washed in warm toluene thus removing the wax and releasing the individual silicon dice. The etchant had completely removed the saw damage area along the edges of the dice. The diffused high conductivity surface layers on the faces of the members were unaffected since they were protected by the composite wax mask and glass sheet. The dice were employed as silicon rectifiers, of a p-n-n+ structure and the rectifiers proved to be highly reliable.

The term "sawing" as employed in the specification and claims is intended to cover any means for severing the wafers into dice. Thus, diamond saws, cavitron cutting using an ultrasonic tool with abrasive, or electron beams may be used for this purpose.

While the process in the above example is preferred since it frees the block 18 for immediate use in cutting more dice while a previous sheet is being etched, in some cases the sawing of the assembly of FIG. 1 may be so carried out as to saw partly or entirely through the lower glass sheet 10, and the acid etchant can be applied to the resulting diced assembly, proper coating being applied to block 18 to prevent any attack thereof. Thereafter the wax or other adhesive may be dissolved and the glass sheets or each die separated therefrom.

It is intended that the above description and drawings be interpreted as illustrative and not limiting.

We claim as our invention:

1. In the process of preparing semiconductor dice suitable for use in a semiconductor device, the steps comprising positioning a flat semiconductor wafer between two flat glass sheets and securing the wafer therebetween with a thin layer of an adhesive applied to and completely coating opposite faces of the wafer, securing the external face of one glass sheet to a dicing block with a thin layer of adhesive, dicing the semiconductor wafer by sawing through the upper glass sheet and the semiconductor wafer to provide a plurality of semiconductor dices, removing from the dicing block the lower glass sheet supporting the semiconductor dice, and applying an etching solution to the saw damaged edges of the semiconductor dice to remove the damaged material at the edges without affecting the faces protected by the applied glass sheets thereby providing a reliable p-n junction at the edges of each die.

2. A method of dicing and selectively etching diffused semiconductor wafers comprising positioning a flat double diffused semiconductor wafer between two flat glass sheets and securing the wafer therebetween with a thin layer of wax applied to and completely coating opposite faces of the wafer, securing the external face of one glass sheet to a dicing block with a thin layer of wax by disposing the wax between the sheet and the block, dicing the semiconductor wafer by sawing through the upper glass sheet and the semiconductor wafer to provide a plurality of semiconductor dice, removing from the dicing block the lower glass sheet supporting the semiconductor dice, and applying an etching solution to the saw damaged edges of the semiconductor dice to remove only the damaged material at the edges whereby to provide a reliable p-n junction at the edges of each die without attacking and removing the diffused high conductivity surfaces thereon.

3. A method of dicing and selectively etching diffused semiconductor wafers comprising positioning a flat double diffused semiconductor wafer between two flat glass sheets and securing the wafer therebetween with a thin layer of wax applied to and completely coating opposite faces of the wafer, securing the external face of one glass sheet to a dicing block with a thin layer of wax by disposing the wax between the sheet and the block, dicing the semiconductor wafer by sawing through the upper glass sheet and the semiconductor wafer to provide a plurality of semiconductor dice, removing from the dicing block the lower glass sheet supporting the semiconductor dice, applying an etching solution to the saw damaged edges of the semiconductor dice to remove only the damaged material at the edges whereby to provide a reliable p-n junction at the edges of each die without attacking and removing the diffused high conductivity surfaces thereon, and removing the glass sheets and wax from both faces of each die.

References Cited in the file of this patent

UNITED STATES PATENTS

| | | |
|---|---|---|
| 1,806,862 | Owen | May 26, 1931 |
| 2,760,314 | Heibel et al. | Aug. 28, 1956 |
| 2,762,954 | Leifer | Sept. 11, 1956 |
| 2,801,909 | Hirdler | Aug. 6, 1957 |
| 2,849,296 | Certa | Aug. 26, 1958 |
| 2,865,082 | Gates | Dec. 23, 1958 |